United States Patent
Palagashvili et al.

(10) Patent No.: US 9,443,753 B2
(45) Date of Patent: Sep. 13, 2016

(54) APPARATUS FOR CONTROLLING THE FLOW OF A GAS IN A PROCESS CHAMBER

(75) Inventors: David Palagashvili, Mountain View, CA (US); Michael D. Willwerth, Campbell, CA (US); Jingbao Liu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 613 days.

(21) Appl. No.: 13/015,106

(22) Filed: Jan. 27, 2011

(65) Prior Publication Data

US 2012/0024479 A1 Feb. 2, 2012

Related U.S. Application Data

(60) Provisional application No. 61/369,239, filed on Jul. 30, 2010.

(51) Int. Cl.
*C23C 16/44* (2006.01)
*C23C 16/455* (2006.01)
(Continued)

(52) U.S. Cl.
CPC ..... *H01L 21/68735* (2013.01); *C23C 16/4412* (2013.01); *C23C 16/4585* (2013.01);
(Continued)

(58) Field of Classification Search
CPC .................. C23C 16/4412; C23C 16/45591; C23C 16/45587; C23C 16/45502; C23C 16/45506; C23C 16/45508; C23C 16/45504; C23C 16/455–16/4551; C23C 16/4583–16/4586; H01J 37/32449; H01J 2237/026–2237/0268; H01J 2237/182–2237/1825; H01J 2237/3322–2237/3328; H01J 37/32623–37/32651; H01J 37/32844; H01J 37/3441; H01J 37/3244; H01J 37/32834; C30B 25/16; C30B 25/165; C30B 25/12–25/14; G05D 7/0629–7/0694; H01L 21/67253; H01L 21/68714–21/68792; Y10T 137/85938

USPC ............ 118/715; 156/345.1, 345.22, 345.33, 156/345.45, 345.51, 345.52, 345.53, 345.54

See application file for complete search history.

(56) References Cited

U.S. PATENT DOCUMENTS 4,270,999 A * 6/1981 Hassan et al. ........... 204/192.32
5,639,334 A    6/1997 Canale et al.
(Continued)

FOREIGN PATENT DOCUMENTS

DE    102005056323    *    5/2007
JP         04240185 A    *    8/1992
(Continued)

OTHER PUBLICATIONS

U.S. Appl. No. 60/820,042 (Dalton et al.) filed Jul. 21, 2006.*
(Continued)

*Primary Examiner* — Jeffrie R Lund
*Assistant Examiner* — Stanislav Antolin
(74) *Attorney, Agent, or Firm* — Moser Taboada; Alan Taboada

(57) ABSTRACT

Apparatus for controlling the flow of a gas in a process chamber is provided herein. In some embodiments, an apparatus for controlling the flow of a gas in a process chamber having a processing volume within the process chamber disposed above a substrate support and a pumping volume within the process chamber disposed below the substrate support may include an annular plate surrounding the substrate support proximate a level of a substrate support surface of the substrate support, wherein the annular plate extends radially outward toward an inner peripheral surface of the process chamber to define a uniform gap between an outer edge of the annular plate and the inner peripheral surface, wherein the uniform gap provides a uniform flow path from the processing volume to the pumping volume.

15 Claims, 3 Drawing Sheets

(51) Int. Cl.
  *C23C 16/458* (2006.01)
  *H01J 37/32* (2006.01)
  *H01L 21/67* (2006.01)
  *H01L 21/687* (2006.01)

(52) U.S. Cl.
  CPC ..... *C23C16/45591* (2013.01); *H01J 37/3244* (2013.01); *H01J 37/32633* (2013.01); *H01J 37/32642* (2013.01); *Y10T 137/85938* (2015.04)

(56) References Cited

U.S. PATENT DOCUMENTS

| | | | |
|---|---|---|---|
| 5,855,675 A * | 1/1999 | Doering et al. | 118/719 |
| 5,868,159 A * | 2/1999 | Loan et al. | 137/334 |
| 5,919,332 A * | 7/1999 | Koshiishi | C23C 16/5096 118/723 E |
| 6,015,590 A * | 1/2000 | Suntola et al. | 427/255.23 |
| 6,039,836 A * | 3/2000 | Dhindsa et al. | 156/345.1 |
| 6,073,576 A * | 6/2000 | Moslehi et al. | 118/723 E |
| 6,123,791 A * | 9/2000 | Han et al. | 156/1 |
| 6,159,299 A * | 12/2000 | Koai et al. | 118/715 |
| 6,190,732 B1 * | 2/2001 | Omstead | C23C 16/4408 118/729 |
| 6,274,495 B1 * | 8/2001 | Omstead | C23C 16/4408 438/680 |
| 6,433,297 B1 | 8/2002 | Kojima et al. | |
| 6,508,197 B1 * | 1/2003 | Omstead | C23C 16/4408 118/715 |
| 6,544,341 B1 * | 4/2003 | Omstead | C23C 16/4408 118/715 |
| 6,554,954 B2 * | 4/2003 | Ma et al. | 156/345.51 |
| 6,692,575 B1 * | 2/2004 | Omstead | C23C 16/4408 118/724 |
| 6,962,164 B2 * | 11/2005 | Lull et al. | 137/2 |
| 7,103,443 B2 * | 9/2006 | Strang | 700/175 |
| 7,138,336 B2 * | 11/2006 | Lee et al. | 438/680 |
| 7,552,521 B2 | 6/2009 | Fink | |
| 7,648,578 B1 * | 1/2010 | Itatani et al. | 118/715 |
| 2001/0025600 A1 | 10/2001 | Ikeda et al. | |
| 2002/0076490 A1 * | 6/2002 | Chiang et al. | 427/248.1 |
| 2002/0160125 A1 * | 10/2002 | Johnson et al. | 427/569 |
| 2003/0079686 A1 * | 5/2003 | Chen | C23C 16/34 118/715 |
| 2003/0159657 A1 * | 8/2003 | Kaushal et al. | 118/723 R |
| 2003/0221780 A1 * | 12/2003 | Lei et al. | 156/345.29 |
| 2004/0083976 A1 * | 5/2004 | Meyyappan | 118/728 |
| 2004/0200417 A1 * | 10/2004 | Hanawa | C23C 14/48 118/723 I |
| 2004/0216667 A1 * | 11/2004 | Mitsuhashi et al. | 118/715 |
| 2005/0059246 A1 * | 3/2005 | Yamada et al. | 438/689 |
| 2005/0211383 A1 * | 9/2005 | Miyata et al. | 156/345.46 |
| 2005/0224180 A1 * | 10/2005 | Bera | C23C 16/4412 156/345.33 |
| 2006/0137609 A1 * | 6/2006 | Puchacz et al. | 118/719 |
| 2006/0236932 A1 * | 10/2006 | Yokogawa et al. | 118/723 E |
| 2007/0022948 A1 * | 2/2007 | Rose et al. | 118/52 |
| 2007/0080141 A1 * | 4/2007 | White et al. | 216/68 |
| 2007/0169891 A1 * | 7/2007 | Koshiishi et al. | 156/345.47 |
| 2007/0215048 A1 * | 9/2007 | Suzuki et al. | 118/725 |
| 2007/0266945 A1 * | 11/2007 | Shuto et al. | 118/723 E |
| 2008/0072821 A1 * | 3/2008 | Dalton et al. | 118/715 |
| 2008/0078746 A1 * | 4/2008 | Masuda | 216/79 |
| 2008/0110567 A1 * | 5/2008 | Miller et al. | 156/345.26 |
| 2008/0179291 A1 * | 7/2008 | Collins | B08B 7/00 216/67 |
| 2008/0264340 A1 * | 10/2008 | Martinson et al. | 118/715 |
| 2009/0025878 A1 * | 1/2009 | Rauf et al. | 156/345.48 |
| 2009/0025879 A1 * | 1/2009 | Rauf et al. | 156/345.48 |
| 2009/0107955 A1 * | 4/2009 | Tiner et al. | 216/67 |
| 2009/0107966 A1 * | 4/2009 | Wojcik et al. | 219/121.72 |
| 2009/0120367 A1 * | 5/2009 | Porshnev | H01J 37/32642 118/723 E |
| 2009/0152243 A1 * | 6/2009 | Horiguchi et al. | 216/69 |
| 2009/0202734 A1 * | 8/2009 | Dhindsa | 427/446 |
| 2010/0126605 A1 * | 5/2010 | Stones | 137/565.23 |
| 2011/0162803 A1 * | 7/2011 | Palagashvili et al. | 156/345.54 |
| 2011/0265821 A1 | 11/2011 | Tay et al. | |

FOREIGN PATENT DOCUMENTS

| | | | | |
|---|---|---|---|---|
| JP | H05-65655 A | | 3/1993 | |
| JP | H08-008239 A | | 1/1996 | |
| JP | 2001-085411 | | 3/2001 | |
| JP | 2001-085412 | | 3/2001 | |
| JP | 2001085411 A | * | 3/2001 | ......... H01L 21/3065 |
| JP | 2001085412 A | * | 3/2001 | ......... H01L 21/3065 |
| JP | 2003068711 A | * | 3/2003 | ......... H01L 21/3065 |
| JP | 2008135739 A | * | 6/2008 | |
| JP | 2009076870 A | * | 4/2009 | |

OTHER PUBLICATIONS

U.S. Appl. No. 60/609,598 (Puchacz; Jerzy P. et al.) filed Sep. 13, 2004.*
Liptak et al, Instrument Engineers' Handbook (4th Edition)—Process Control and Optimization, vol. 2. (2006) Taylor & Francis pp. 1234-1261.*
T. Walters. "Gas-flow Calculations: Don't Choke." Chemical Engineering Magazine. Jan. 2000. Chemical Week Associates, New York. pp. 70-76.*
Genick Bar—Meir. "Fundamentals of Compressible Fluid Mechanics." Version (0.4.8.3 Sep. 17, 2008). Minneapolis, MN. pp. 1-313. Available: http://www.freeinfosociety.com/media/pdf/2827.pdf. Accessed: Dec. 3, 2014. See also: http://www.potto.org/ for Version (0.4.9.8 Mar. 17, 2013).*
"Extend, v.". OED Online. Dec. 2014. Oxford University Press. http://www.oed.com/view/Entry/66923?redirectedFrom=extend& (accessed Mar. 11, 2015) pp. 7.*
"Beneath, adv., prep., and adj.". OED Online. Dec. 2014. Oxford University Press. http://www.oed.com/view/Entry/17641?redirectedFrom=beneath (accessed Mar. 11, 2015) pp. 5.*
Search Report dated Feb. 17, 2015 and Office Action dated Feb. 23, 2015 from the corresponding Japanese application (JP 20130521942) of the present application.*
International Search Report and Written Opinion mailed Mar. 8, 2012 for PCT Application No. PCT/US2011/045550.
Search Report received from The State Intellectual Property Office of the People's Republic of China for Chinese Application No. 201180036999X.

* cited by examiner

APPARATUS FOR CONTROLLING THE FLOW OF A GAS IN A PROCESS CHAMBER

CROSS-REFERENCE TO RELATED APPLICATIONS

This application claims benefit of U.S. provisional patent application Ser. No. 61/369,239, filed Jul. 30, 2010, which is herein incorporated by reference.

FIELD

Embodiments of the present invention generally relate to semiconductor processing and, more particularly, to apparatus for processing substrates.

BACKGROUND

As the critical dimensions for semiconductor devices continue to shrink, there is an increased need for semiconductor process equipment that can uniformly process semiconductor substrates. One instance of where this need may arise is in controlling the flow of process gases proximate the surface of a substrate disposed in a process chamber. The inventors have observed that, in conventional process chambers that utilize a single pump to exhaust process gases from a side of the process chamber, process non-uniformities (for example, non-uniform etch rates and/or non-uniform critical dimensions) exist that are believed to be due, at least in part, to non-uniform asymmetric flow of process gases in the process chamber. In addition, the inventors have further observed that such an asymmetric flow of process gases may further cause plasma non-uniformities.

Thus, the inventors have provided an improved apparatus for processing substrates.

SUMMARY

Apparatus for controlling the flow of a gas in a process chamber is provided herein. In some embodiments, an apparatus for controlling the flow of a gas in a process chamber having a processing volume within the process chamber disposed above a substrate support and a pumping volume within the process chamber disposed below the substrate support may include an annular plate surrounding the substrate support proximate a level of a substrate support surface of the substrate support, wherein the annular plate extends radially outward toward an inner peripheral surface of the process chamber to define a uniform gap between an outer edge of the annular plate and the inner peripheral surface, wherein the uniform gap provides a uniform flow path from the processing volume to the pumping volume.

In some embodiments, an apparatus for controlling the flow of a gas in a process chamber having a processing volume within the process chamber disposed above a substrate support and a pumping volume within the process chamber disposed below the substrate support may include an annular plate surrounding the substrate support proximate a level of a substrate support surface of the substrate support, wherein the annular plate extends radially outward toward a wall of the process chamber to define a uniform gap between an outer edge of the annular plate and an inner peripheral surface of the process chamber that sufficiently restricts flow from the processing volume to the pumping volume to maintain a choked flow condition when flowing a gas from the processing volume to the pumping volume.

In some embodiments an apparatus for controlling flow of gas in a process chamber may include a process chamber having a processing volume within the process chamber disposed above a substrate support and a pumping volume within the process chamber disposed below the substrate support, wherein the substrate support comprises an electrostatic chuck; an annular plate surrounding the substrate support proximate a level of a substrate support surface of the substrate support, wherein the annular plate extends radially outward toward a wall of the process chamber to define a uniform gap between an outer edge of the annular plate and an inner peripheral surface of the process chamber that sufficiently restricts flow from the processing volume to the pumping volume to maintain a choked flow condition when flowing a gas from the processing volume to the pumping volume; and a pump port disposed on a side of the process chamber to provide an asymmetric flow of gas within the process chamber.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
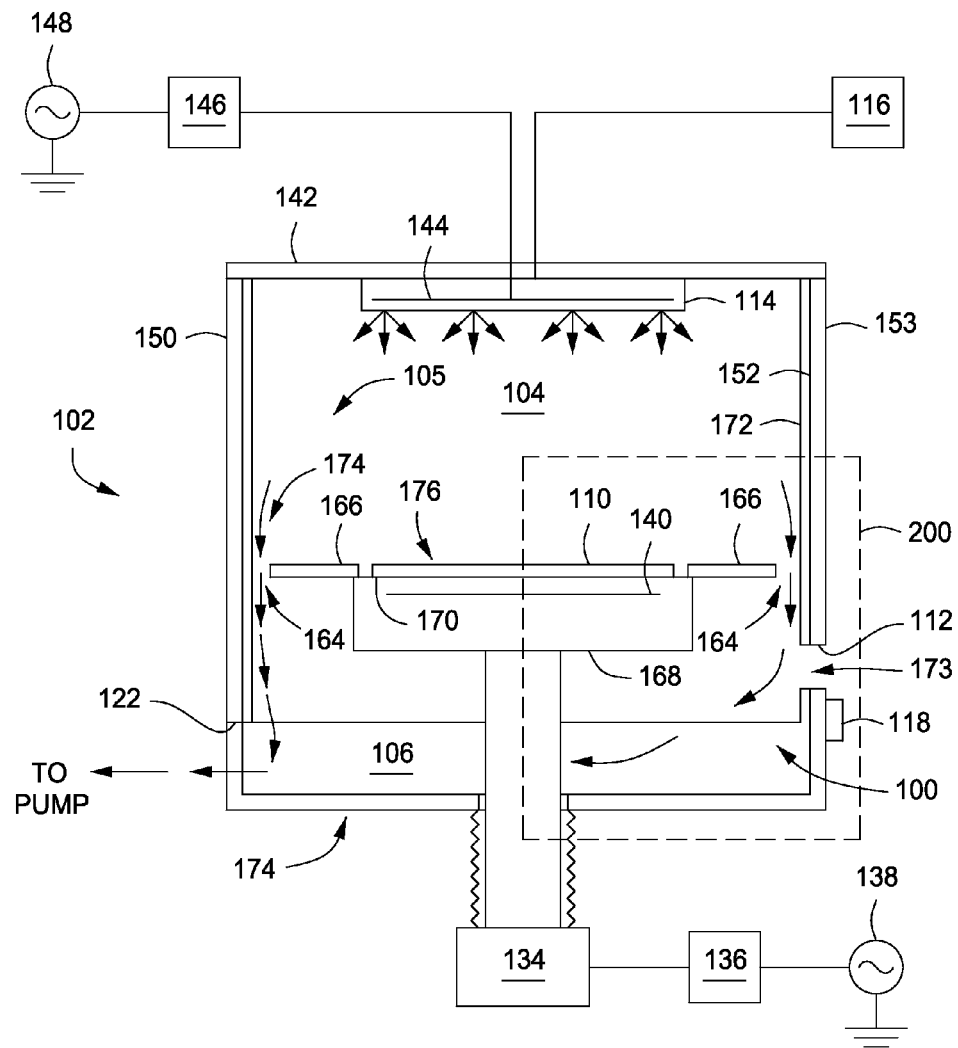
FIG. 1 is a schematic view of a process chamber suitable for use with an apparatus for controlling the flow of a gas in a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to an apparatus for controlling the flow of a gas in a process chamber. The inventive apparatus may advantageously provide a restricted uniform flow path for gases flowing from a processing volume to a pumping volume in a process chamber. The restricted flow path may create choked flow conditions, thereby reducing flow conductance upstream of the flow path, thus providing a uniform flow of gases in the processing volume independent of a non-uniform or asymmetric pressure gradient that may exist in the pumping volume due to an asymmetric pump configuration.

FIG. 1 is a schematic view of process chamber 102 suitable for use with an apparatus for controlling the flow of a gas in a process chamber in accordance with some embodiments of the present invention. The process chamber 102 may be any process chamber having an asymmetric, or offset exhaust system for removing excess process gases, processing by-products, or the like, from the interior of the process chamber (e.g., offset pump port 122 depicted in FIG. 1). Exemplary process chambers that may be modified to advantage using the invention disclosed herein may include the DPS®, ENABLER®, ADVANTEDGE™, PRODUCER®, or other process chambers, available from Applied Materials, Inc. of Santa Clara, Calif. Other suitable process chambers include any process chambers that may require substantially uniform pressure, flow, and/or residence time of process gases flowing therethrough, or uniform plasma processing, including chambers having symmetrically arranged pumping ports. In some embodiments, the process chambers comprise a dual chamber configuration, wherein both process chambers share a single pumping port.

The process chamber 102 generally comprises a chamber body 150 having an inner volume 105 that may include a processing volume 104 and pumping volume 106. The processing volume 104 may be defined, for example, between a substrate support 168 disposed within the process chamber 102 having a top surface 170 for supporting a substrate 110 thereupon during processing and one or more gas inlets, such as a showerhead 114 and/or nozzles provided at desired locations. The pumping volume 106 may be defined, for example, between the substrate support 168 and a bottom 174 of the process chamber 102. The pumping volume 106 is drawn through the pump port 122 to an exhaust system. For example, a vacuum pump (not shown) may be provided to pump out the exhaust gases from the process chamber 102 and route the exhaust to appropriate exhaust handling equipment. A valve (for example, a gate valve) may be provided in the exhaust system to facilitate control of the flow rate of the exhaust gases in combination with the operation of the vacuum pump.

In some embodiments, a liner 172 may be disposed within the process chamber 102 to protect the walls 153 of the process chamber 102 from damage due to processing (such as from the plasma or from sputtering or other process byproducts from the substrate 110). In some embodiments, the liner 172 may be removable to facilitate cleaning and/or conditioning of the liner 172 and/or walls 153. In some embodiments, the liner 172 may comprise openings that correspond to openings in the process chamber. For example, an opening 173 may be provided to correspond with a slit valve opening 112. In embodiments where gas inlets are provided in the sidewalls of the chamber, openings may be provided to facilitate gas flow into processing volume 104 of the process chamber 102. In some embodiments, the liner 172 may further extend to line the ceiling 142 of the process chamber 102. Suitable materials for fabricating the liner may include conductive materials or dielectric materials. In embodiments where the walls 153 of the process chamber 102 are grounded, the liner 172 may be fabricated from conductive materials.

The one or more gas inlets (e.g., the showerhead 114) may be coupled to a gas supply 116 for providing one or more process gases into the processing volume 104 of the process chamber 102. Although a showerhead 114 is shown in FIG. 1, additional or alternative gas inlets may be provided such as nozzles or inlets disposed in the ceiling or on the sidewalls of the process chamber 102 or at other locations suitable for providing gases as desired to the process chamber 102.

In some embodiments, RF power may be capacitively coupled to an upper electrode proximate an upper portion of the process chamber 102. For example, the upper electrode may be a conductor formed, at least in part, by one or more of a ceiling 142, a showerhead 114, an electrode 144 disposed in the showerhead, or the like, fabricated from a suitable conductive material. One or more RF power sources (one RF power source 148 shown) may be coupled through one or more respective matching networks (matching network 146 shown) to the upper electrode. The one or more plasma sources may be capable of producing RF power at a desired frequency (e.g., about 13.56 MHz, about 60 MHz, about 162 MHz, or the like).

In some embodiments, inductively coupled RF power may be provided for processing. For example, the process chamber 102 may have a ceiling 142 made from a dielectric material and a dielectric showerhead 114. An antenna comprising at least one inductive coil element may be disposed above the ceiling 142. The inductive coil elements may be coupled to one or more RF power sources (such as the RF power source 148) through one or more respective matching networks (matching network 146 shown).

The substrate 110 may enter the process chamber 102 via an opening 112 in a wall 152 of the process chamber 102. The opening 112 may be selectively sealed via a slit valve 118, or other mechanism for selectively providing access to the interior of the chamber through the opening 112. The substrate support 168 may be coupled to a lift mechanism 134 that may control the position of the substrate support 168 between a lower position suitable for transferring substrates into and out of the chamber via the opening 112 and a selectable upper position (as shown) suitable for processing. The process position may be selected to maximize process uniformity for a particular process step. When in at least one of the elevated processing positions, the substrate support 168 may be disposed above the opening 112 to provide a symmetrical processing region (e.g., processing volume).

In some embodiments, the substrate support 168 may include an RF bias electrode 140. The RF bias electrode 140 may be coupled to one or more bias power sources (one bias power source 138 shown) through one or more respective matching networks (matching network 136 shown). The one or more bias power sources may be capable of producing RF power at a desired frequency (e.g., about 2 MHz, or about 13.56 MHz, or about 60 MHz). The one or more bias power sources may provide either continuous or pulsed power. Alternatively, in some embodiments, the bias power source may be a DC or pulsed DC source.

In some embodiments, the substrate support 168 may include a mechanism that retains or supports the substrate 110 on the surface of the substrate support 168, such as an electrostatic chuck, a vacuum chuck, a substrate retaining clamp, or the like. In some embodiments, the substrate support 168 may include mechanisms for controlling the substrate temperature (such as heating and/or cooling devices, and/or for controlling the species flux and/or ion energy proximate the substrate surface.

An annular plate 166 may be disposed about the substrate support 168 to control a flow of gas from the processing volume 104 to the pumping volume 106. The annular plate may comprise any material suitable, for example, such as quartz ($SiO_2$), or a ceramic, such as yttrium (Y) containing ceramic. The annular plate 166 extends radially outward towards a wall 152 of the chamber body 150 of the process chamber 102 defining a uniform gap 164 between an outer edge 174 of the annular plate 166 and an inner surface 152 of the wall 153. In embodiments where the liner 172 is present, the annular plate 166 may define a uniform gap 164 between the outer edge 174 of the annular plate 166 and the liner 172. The annular plate prevents, or substantially prevents, gas flow between the annular plate and the substrate support 168 and restricts flow to only, or predominantly, through the uniform gap 164.

The annular plate 166 operates as a baffle to alter the flow of gases flowing from the processing volume 104 to the pumping volume 106. For example, in operation, as a gas is evacuated from the processing volume through the pumping volume via the pumping port 122, the annular plate 166 restricts the flow of gas from the processing volume 104 to the pumping volume 106 due to the uniform gap 164. The restriction of the flow of gas provides a reduced flow conductance sufficient to provide a uniform flow of the gas across the top surface 170 of the substrate support 168 (and a substrate disposed thereon). In some embodiments the size of the uniform gap 164 may be sufficiently small so as to create a choked flow condition. In addition, by restricting the flow of gas, a pressure drop is created at the uniform gap 164, thereby creating a more uniform pressure across the top surface 170 of the substrate support 168. In some embodiments, the pressure drop from the processing volume 104 to the pumping volume 106 at the uniform gap 164 may be about 0 to about 40 mTorr.

Figure 3:
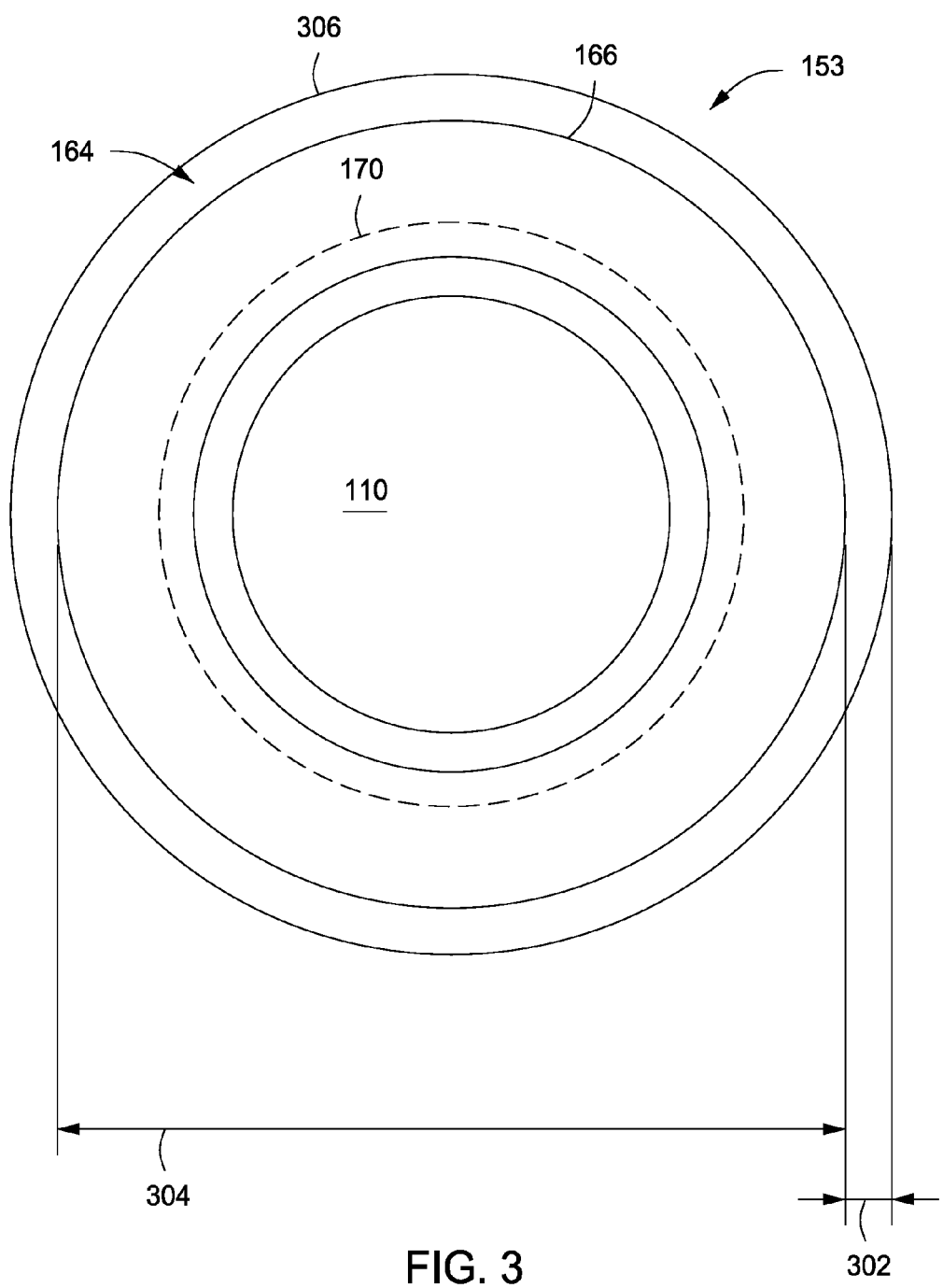
FIG. 3 is top view of an apparatus for controlling the flow of a gas in a process chamber in accordance with some embodiments of the present invention.

The annular plate 166 may be configured to match the design of the process chamber and substrate support in which the annular plate 166 is used. In some embodiments, the annular plate 166 is generally circular and circumscribes the substrate support 168. The annular plate 168 may have any dimensions suitable to provide a uniform gas flow and pressure in a desired process chamber and at desired process conditions. For example, in some embodiments, and as shown in FIG. 3, the annular plate 166 may have any dimensions suitable to provide a uniform gap 164 that is sufficiently small to facilitate a substantially uniform gas flow and pressure in a desired process chamber and at desired process conditions. For example, in some embodiments, the uniform gap 164 may have a width 302 (defined as a perpendicular distance between an inner peripheral surface 306 of the process chamber—which may be, for example, the inner surface 152 of the wall 153 or the liner 172 (when present)—and the outer edge 174 of the annular plate 166) of about 0.09 inches to about 1.24 inches. In some embodiments, such as for process chambers for processing 300 mm semiconductor wafers, the annular plate 166 may have an outer diameter 304 of about 15 inches to about 17.3 inches. In some embodiments, the annular plate 166 may have a thickness of about 0.12 inches to about 1 inch.

Returning to FIG. 1, the annular plate 166 may be disposed about the substrate support 168 in any position suitable to provide sufficient gas flow uniformity with respect to flow characteristics of the gas and process chamber geometry. For example, in some embodiments, the annular plate 166 may be positioned such that the annular plate 166 is approximately even with and substantially parallel to the top surface 170 of the substrate support 168. Alternatively, in some embodiments, the annular plate 166 may be positioned such that the annular plate 166 is approximately even with and substantially parallel to a top surface 176 of the substrate 110 disposed on the substrate support 168.

In some embodiments, the annular plate 166 may be coupled to the substrate support 168. In some embodiments, the annular plate 166 may be supported by the substrate support 168. In some embodiments, at least a portion of the annular plate 166 overlaps with at least a portion of the substrate support 168 to prevent gas flow between the substrate support 168 and the annular plate 166. In some embodiments, the annular plate 166 may be coupled to, or may be an extension of, a process kit, for example such as a deposition ring 220 (depicted in FIG. 2).

Figure 2:
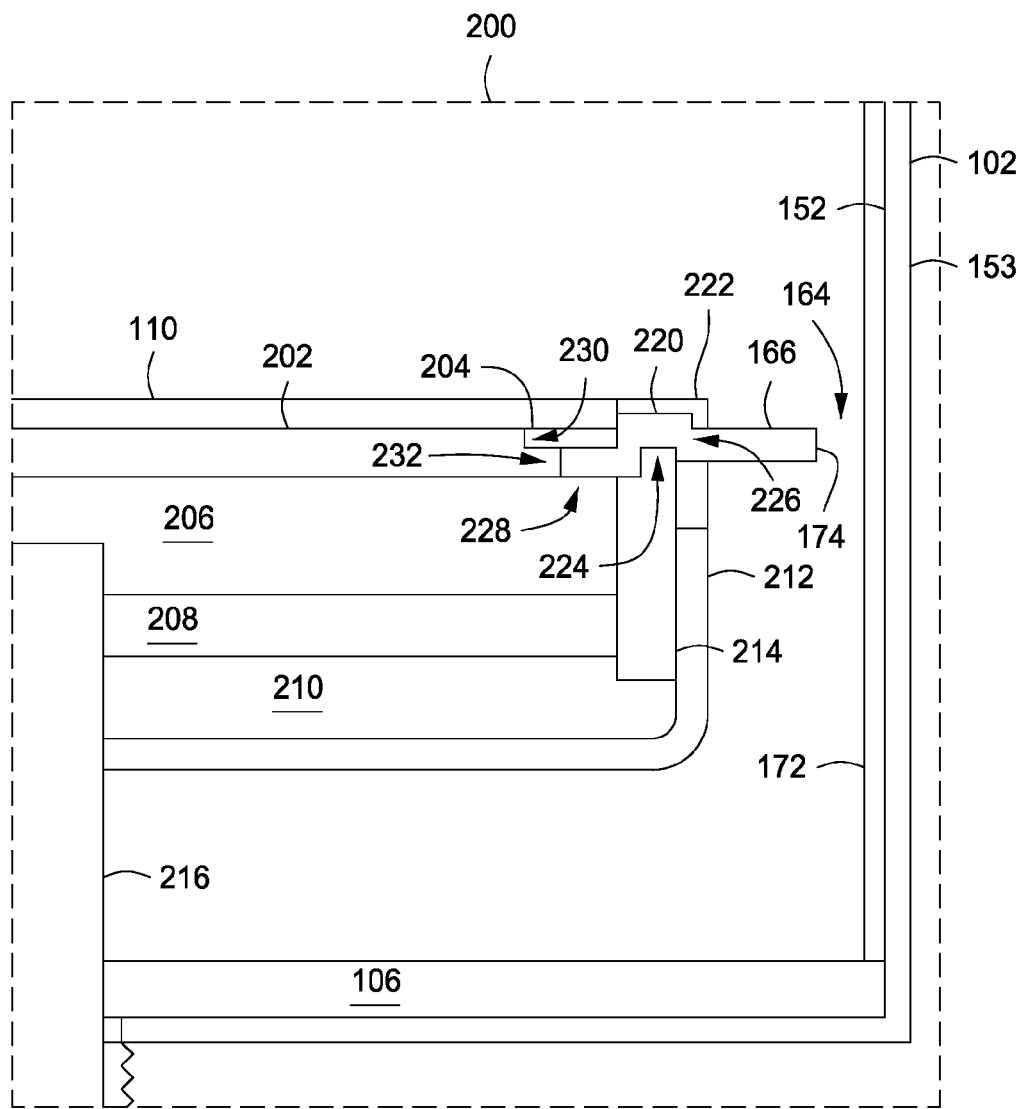
FIG. 2 is a partial cross-sectional side-view of an apparatus for controlling the flow of a gas in a process chamber in accordance with some embodiments of the present invention.

Referring to FIG. 2, in some embodiments, the substrate support 168 may generally comprise a central shaft 216 supporting a support housing 212 and an insulating layer 210, vacuum plate 208, cooling plate 206 and electrostatic chuck 202 disposed within the support housing 212. Substrate supports having other configurations may also suitably be provided with the annular plate 166 in accordance with the teachings provided herein. In some embodiments, the deposition ring 220 may be disposed atop the substrate support 168 and disposed around the substrate 110 to cover otherwise exposed portions of the substrate support 168. The deposition ring 220 protects portions of the substrate support 168 from damage due to processing (such as from the plasma or from sputtering or other process byproducts from the substrate 110). The deposition ring 220 may be fabricated from any process compatible electrically insulative material. For example, in some embodiments, the deposition ring 206 may be fabricated from a dielectric material, such as quartz ($SiO_2$), or a ceramic, for example a yttrium (Y) based ceramic, aluminum nitride (AlN), silicon nitride (SiN), or the like. In some embodiments, the deposition ring 220 and the annular plate 166 may comprise the same, or in some embodiments, a different material.

In some embodiments, the deposition ring 220 may be disposed on a ledge 228 of the cooling plate 206. The deposition ring 220 has a central opening that generally corresponds with the shape of the substrate 110. In some embodiments, the deposition ring 220 may extend beneath the substrate 110, although not in direct contact therewith. In some embodiments, the deposition ring 220 also generally surrounds the electrostatic chuck 202. In some embodiments, a narrow gap may be defined between the inner edge 230 of the deposition ring 220 and the outer edge 232 of the electrostatic chuck 202. In some embodiments, the deposition ring 220 may comprise one or more features (one shown) 226 configured to mate with one or more features (one shown) 224 of a support 214 to provide stability and proper placement of the deposition ring 220. In some embodiments, a deposition shield 222 may be provided atop the deposition ring 220 to further protect portions of the process chamber and/or components thereof, from unwanted deposition during processing. In some embodiments, an isolation ring 204 may be disposed atop the electrostatic chuck 202 and deposition ring 220 to provide a lengthened and/or discontinuous path between the processing volume and the cooling plate, or other RF hot components, to prevent or limit any arcing that may occur.

The cooling plate 206 may comprise any material suitable to provide an adequate heat transfer from the chuck 202 to the cooling plate 205. For example, in some embodiments, the cooling plate 206 may be fabricated from a metal, such as aluminum, nickel, or the like. In some embodiments, the cooling plate 206 may comprise one or more channels (not shown) formed therein for circulating a coolant to further facilitate a heat transfer from the chuck 202 to the cooling plate 206.

The insulating layer 210 may comprise any electrically insulating material suitable to provide an electrical insulation while providing adequate and stable support during processing. For example, in some embodiments, the insulating layer 210 may comprise a dielectric material, for example, a ceramic, aluminum nitride (AlN), silicon nitride (SiN), or the like. The support housing 212 provides mechanical support to the insulating layer 210 and may be fabricated from a metal, for example aluminum. In embodiments where the support housing 212 is fabricated from an electrically conductive metal, the support housing 212 may be grounded, for example via a connection to a grounded portion of the process chamber 102.

Thus, an apparatus for controlling a flow of gas in a process chamber is provided herein. Embodiments of the present invention generally relate to an apparatus for controlling the flow of a gas in a process chamber. The inventive apparatus may advantageously provide a restricted uniform flow path for gases flowing from a processing volume to a pumping volume in a process chamber. The restricted flow path may create choked flow conditions, thereby reducing flow conductance upstream of the flow path, thus providing a uniform flow of gases in the processing volume.

While the foregoing is directed to embodiments of the present invention, other and further embodiments of the invention may be devised without departing from the basic scope thereof.

The invention claimed is:

1. Apparatus for controlling the flow of a gas in a process chamber having a processing volume within the process chamber disposed above a substrate support and a pumping volume within the process chamber disposed below the substrate support, the apparatus comprising:
an annular plate coupled to and surrounding the substrate support proximate a level of a substrate support surface of the substrate support, wherein the annular plate extends beneath a position corresponding to a substrate, when disposed on the substrate support, and radially outward toward an inner peripheral surface of the process chamber to define a uniform gap between an outer edge of the annular plate and the inner peripheral surface, wherein the uniform gap provides a uniform flow path from the processing volume to the pumping volume, wherein the annular plate extends radially outward from an inner edge of the annular plate, then up, outward, and down to form a feature configured to mate with a corresponding feature of the substrate support, and then radially outward to the outer edge of the annular plate,
wherein the uniform gap sufficiently restricts flow through the uniform flow path to maintain a choked flow condition when flowing a gas vertically between the outer edge of the annular plate and the inner peripheral surface of the process chamber from the processing volume to the pumping volume, and
wherein the uniform flow path is the only flow path from the processing volume to the pumping volume.

2. The apparatus of claim 1, wherein the uniform gap has a width of about 0.09 to about 1.24 inches.

3. The apparatus of claim 1, wherein the process chamber comprises a liner disposed adjacent to an inner surface of a wall of the process chamber, and wherein the liner defines at least a portion of the inner peripheral surface such that the uniform gap is defined by the outer edge of the annular plate and the liner.

4. The apparatus of claim 1, wherein the annular plate comprises quartz (SiO$_2$), yttrium (Y), or a ceramic.

5. The apparatus of claim 1, wherein the substrate support comprises an electrostatic chuck.

6. The apparatus of claim 1, wherein the substrate support comprises a lift configured to move the substrate support in a vertical direction.

7. The apparatus of claim 1, wherein the process chamber comprises a pump port disposed on a side of the process chamber to provide an asymmetric pressure gradient in the pumping volume.

8. The apparatus of claim 1, wherein the annular plate extends directly beneath the substrate.

9. Apparatus for controlling the flow of a gas in a process chamber having a processing volume within the process chamber disposed above a substrate support and a pumping volume within the process chamber disposed below the substrate support, the apparatus comprising:
an annular plate coupled to and surrounding the substrate support proximate a level of a substrate support surface of the substrate support, wherein the annular plate has an upper surface and an opposing lower surface that is substantially parallel to the upper surface along substantially the entire length of the upper surface, wherein the annular plate extends beneath a position corresponding to a substrate, when disposed on the substrate support, and radially outward toward a wall of the process chamber to define a uniform gap between an outer edge of the annular plate and an inner peripheral surface of the process chamber that sufficiently restricts flow from the processing volume to the pumping volume to maintain a choked flow condition when flowing a gas vertically between the outer edge of the annular plate and the inner surface of the process chamber from the processing volume to the pumping volume, wherein the annular plate extends radially outward from an inner edge of the annular plate, then up, outward, and down to form a feature configured to mate with a corresponding feature of the substrate support, and then radially outward to the outer edge of the annular plate, wherein the uniform gap defines the only flow path from the processing volume to the pumping volume.

10. The apparatus of claim 9, wherein the uniform gap has a width of about 0.09 to about 1.24 inches.

11. The apparatus of claim 9, wherein the process chamber comprises a liner disposed adjacent to the inner surface of the wall and wherein the liner defines at least a portion of the inner peripheral surface such that the uniform gap is defined by the outer edge of the annular plate and the liner.

12. The apparatus of claim 9, wherein the annular plate comprises quartz (SiO$_2$), yttrium (Y) or a ceramic.

13. The apparatus of claim 9, wherein the substrate support comprises an electrostatic chuck.

14. The apparatus of claim 9, wherein the substrate support comprises a lift configured to move the substrate support in a vertical direction.

15. The apparatus of claim 9, wherein the process chamber comprises a pump port disposed on a side of the process chamber to provide an asymmetric pressure gradient in the pumping volume.

* * * * *